US012787782B2

(12) United States Patent
Sasaki et al.

(10) Patent No.: US 12,787,782 B2
(45) Date of Patent: Nov. 3, 2026

(54) SEMICONDUCTOR DEVICE

(71) Applicant: DENSO CORPORATION, Kariya-city (JP)

(72) Inventors: Yoichi Sasaki, Kariya-city (JP); Satoru Wakiyama, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 497 days.

(21) Appl. No.: 18/472,350

(22) Filed: Sep. 22, 2023

(65) Prior Publication Data

US 2024/0170367 A1 May 23, 2024

(30) Foreign Application Priority Data

Nov. 22, 2022 (JP) ................................ 2022-186525

(51) Int. Cl.

| | |
|---|---|
| ***H10W 74/01*** | (2026.01) |
| ***H10W 40/77*** | (2026.01) |
| ***H10W 70/60*** | (2026.01) |
| ***H10W 70/65*** | (2026.01) |
| ***H10W 70/695*** | (2026.01) |
| ***H10W 74/10*** | (2026.01) |

(52) U.S. Cl.

CPC ........ *H10W 40/778* (2026.01); *H10W 70/611* (2026.01); *H10W 70/614* (2026.01); *H10W 70/65* (2026.01); *H10W 70/695* (2026.01); *H10W 74/019* (2026.01); *H10W 74/111* (2026.01)

(58) Field of Classification Search

CPC .. H10W 74/129; H10W 74/019; H10W 70/09

See application file for complete search history.

(56) References Cited

U.S. PATENT DOCUMENTS

| | | | | |
|---|---|---|---|---|
| 9,859,233 | B1 * | 1/2018 | Fan ........................ | H10W 70/09 |
| 10,304,801 | B2 | 5/2019 | Huang et al. | |
| 10,714,426 | B2 | 7/2020 | Hsieh et al. | |
| 10,950,577 | B2 | 3/2021 | Hsieh et al. | |
| 2014/0124941 | A1 | 5/2014 | Sakamoto | |
| 2016/0111384 | A1 * | 4/2016 | Tseng .................. | H10W 74/012 257/737 |
| 2017/0098588 | A1 * | 4/2017 | Yang ................... | H10W 74/129 |
| 2021/0043545 | A1 * | 2/2021 | Huang ................ | H10W 20/023 |

(Continued)

FOREIGN PATENT DOCUMENTS

| | | |
|---|---|---|
| JP | 2016-219646 A | 12/2016 |
| JP | 2022-016126 A | 1/2022 |

OTHER PUBLICATIONS

U.S. Appl. No. 18/472,309, filed Sep. 22, 2023, Sasaki et al.

*Primary Examiner* — Mohsen Ahmadi

(74) *Attorney, Agent, or Firm* — Posz Law Group, PLC

(57) ABSTRACT

A semiconductor device includes: a die; a mold material layer in which the die is embedded in a state where an electrode surface of the die is exposed from the mold material layer; and a redistribution layer provided on a surface of the mold material layer and having an insulating layer and a wiring in a multilayer state, as a fan out wafer level package. The wiring of the redistribution layer has a reinforcing portion that is thicker in a thickness direction within an area corresponding to a boundary region between the die and the mold material layer than the other area.

14 Claims, 6 Drawing Sheets

(56) References Cited

U.S. PATENT DOCUMENTS

| | | | | |
|---|---|---|---|---|
| 2021/0057352 | A1* | 2/2021 | Agarwal | H10P 72/74 |
| 2023/0064152 | A1* | 3/2023 | Chen | H10P 74/207 |
| 2023/0170258 | A1* | 6/2023 | Huang | H10P 54/00<br>257/773 |
| 2024/0203925 | A1* | 6/2024 | Chiu | H10W 70/635 |

* cited by examiner

SEMICONDUCTOR DEVICE

CROSS REFERENCE TO RELATED APPLICATION

This application is based on Japanese Patent Application No. 2022-186525 filed on Nov. 22, 2022, the disclosure of which is incorporated herein by reference.

TECHNICAL FIELD

The present disclosure relates to a semiconductor device.

BACKGROUND

A fan out wafer level package (FOWLP) technology is used for an electronic device such as a mobile device.

SUMMARY

A semiconductor device includes: a die; a mold material layer in which the die is embedded in a state where an electrode surface of the die is exposed from the mold material layer; and a redistribution layer provided on a surface of the mold material layer and having an insulating layer and a wiring in a multilayer state as a fan out wafer level package. The wiring of the redistribution layer has a reinforcing portion that is thicker in a thickness direction within an area corresponding to a boundary region between the die and the mold material layer than the other area.

DESCRIPTION OF EMBODIMENTS

Figure 1A:
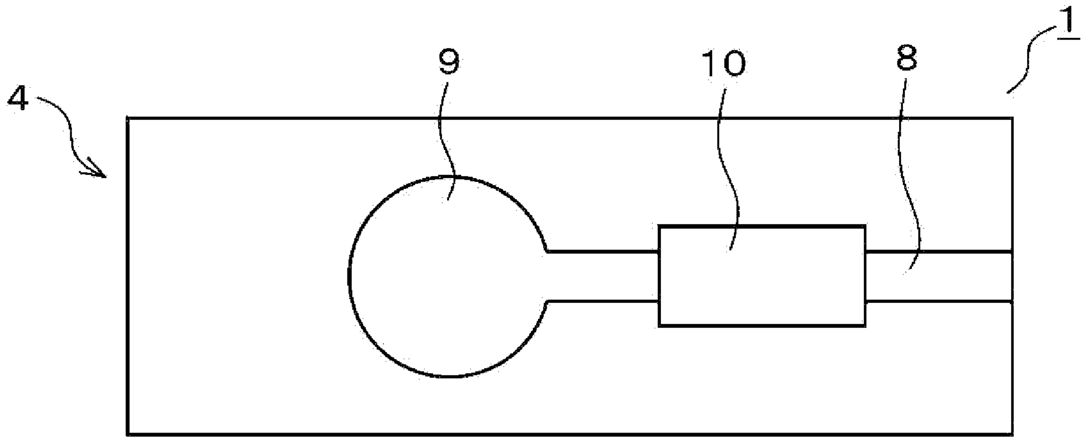
FIG. 1A is a schematic plan view illustrating a semiconductor device according to a first embodiment.

In recent years, a fan out wafer level package (FOWLP) is known as a packaging technology for a semiconductor device such as an IC mounted on an electronic device such as a mobile device. In this type of semiconductor device, a die such as semiconductor chip is sealed with resin material in a state where an electrode surface is exposed from a front surface to form a mold material layer. Further, a redistribution layer having an insulating layer and a wiring in a multilayer state is provided on the die and the mold material layer. Accordingly, it is possible to achieve miniaturization, thinning, and improvement in signal transmission quality.

In the semiconductor package in which the die is sealed with the mold material layer, bending stress is generated in a boundary region between the die and the mold material layer due to a difference in a linear expansion coefficient between the die and the mold material layer when the semiconductor package is subjected to a temperature change during use. A crack may be generated in the wiring of the redistribution layer at the boundary region, which may lead to disconnection. In order to cope with such an issue, a width of the wiring extending across a boundary between the die and the mold material layer is made thicker than that of the other portion to increase strength and improve robustness against disconnection.

However, when the width dimension of the wiring in the redistribution layer is increased, the wiring area in a plan view is increased and the wiring property is deteriorated. It is also considered that the stress acting on the wiring is relaxed by forcibly bending the wiring partially so as to intersect the boundary between the die and the mold material layer in an oblique direction instead of crossing the boundary at a right angle. However, this method also causes an increase in the wiring area in a plan view. Further, since the wiring is irregularly bent, the wiring property deteriorates, which leads to impedance mismatching of the wiring and causes a decrease in the signal quality in the high-speed communication wiring.

The present disclosure provides a semiconductor device, which is a fan out wafer level package, to further improve the robustness against disconnection due to thermal stress in a wiring of a redistribution layer.

According to an aspect of the present disclosure, a semiconductor device includes: a die; a mold material layer in which the die is embedded in a state where an electrode surface of the die is exposed from the mold material layer; and a redistribution layer provided on a surface of the mold material layer and having an insulating layer and a wiring in a multilayer state, as a fan out wafer level package. The wiring of the redistribution layer has a reinforcing portion that is thicker in a thickness direction within an area corresponding to a boundary region between the die and the mold material layer than the other area.

Accordingly, the wiring of the redistribution layer has the reinforcing portion that is thicker in the thickness direction within the area corresponding to the boundary region between the die and the mold material layer than the other area. Since the reinforcing portion is thick, the reinforcing portion has higher rigidity in the area than the other area. Therefore, the mechanical strength can be increased by the reinforcing portion when a bending stress acts on the boundary region between the die and the mold material layer due to a difference in linear expansion coefficient, which is generated by a temperature change during use. Thus, the occurrence of cracks and disconnections can be suppressed.

Since the reinforcing portion is provided by being thickened in the thickness direction of the redistribution layer, it is not necessary to increase the width of the wiring or irregularly bend the wiring in a plan view. Therefore, it is possible to suppress an increase in the wiring area as viewed in the surface direction and to secure the wiring property. As a result, in the fan out wafer level package, there is an excellent effect that the robustness of the wiring of the redistribution layer against disconnection due to thermal stress can be further enhanced.

Hereinafter, embodiments will be described with reference to the drawings. The same reference numerals are given to the same portions among the embodiments, and the repetitive description thereof may be omitted. In the drawings, a front surface of a die of a semiconductor device having an electrode is illustrated as an upper surface. In order to make the drawings easy to see, a wiring and the like are shown in a solid line in a plan view, and hatching may be omitted in, for example, an insulating layer in a cross-sectional view.

Figure 1B:
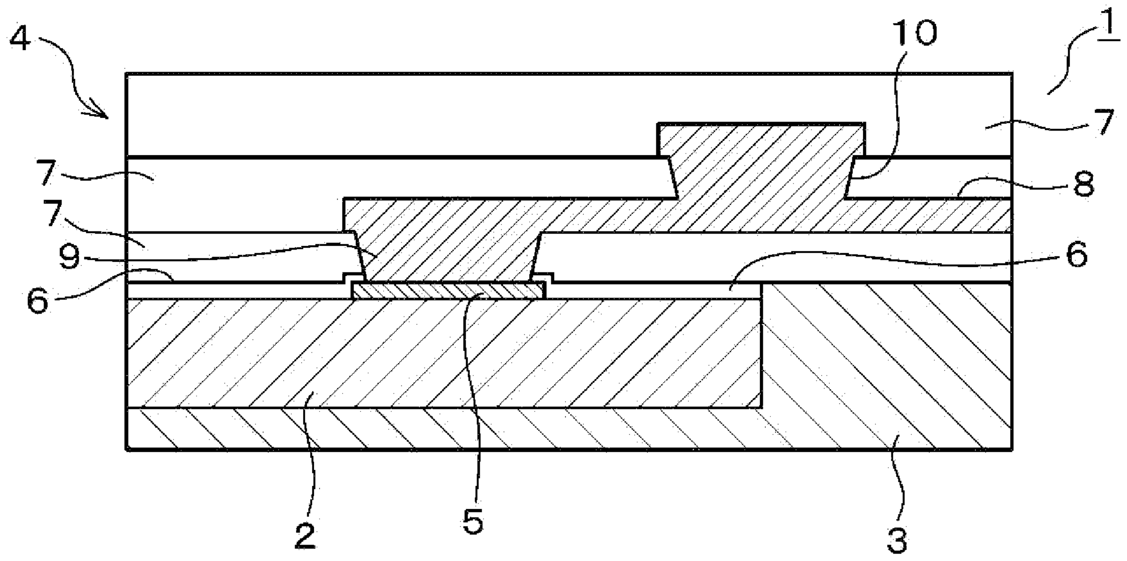
FIG. 1B is a schematic cross-sectional view illustrating the semiconductor device of the first embodiment.
Figure 2:
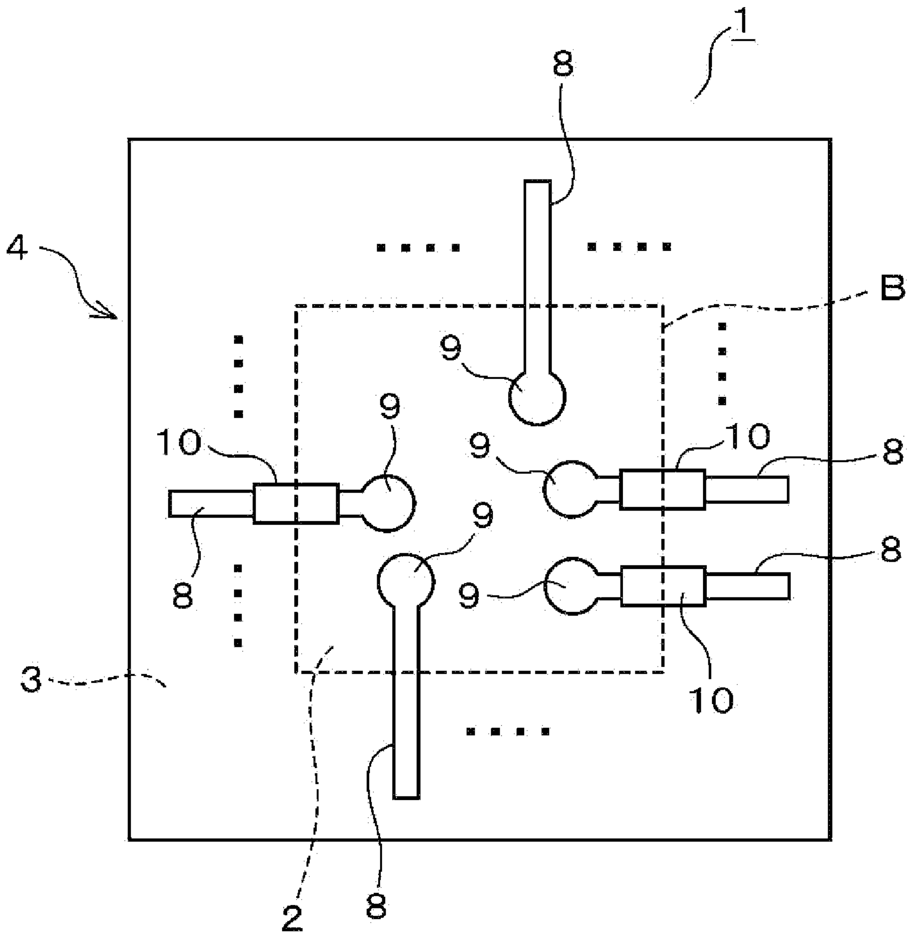
FIG. 2 is a schematic plan view illustrating a wiring and a reinforcing portion of the semiconductor device.

A first embodiment will be described with reference to FIGS. 1A to 5. FIGS. 1A, 1B and 2 show a configuration of a fan out wafer level package (FOWLP) semiconductor device 1 according to the present embodiment. The semiconductor device 1 includes a die 2 which is a semiconductor chip, a mold material layer 3 and a redistribution layer 4, and has a thin rectangular shape as a whole. The die 2 is embedded in the mold material layer 3 in a state where an electrode is exposed from the surface. The redistribution layer 4 is provided on a surface layer of the die 2 and the mold material layer 3.

As shown in FIG. 2, the die 2 has a quadrangular chip shape, and plural (such as five) electrode pads 5, for example, made of aluminum are provided on the upper surface of the die 2. As shown in FIG. 1B, a surface protective film 6 made of an insulating material is provided so as to expose the electrode pad 5. The mold material layer 3 is made of, for example, a resin material such as an epoxy resin, and is provided so as to cover the lower surface and the side surface of the die 2. The redistribution layer 4 includes an insulating layer 7 and a wiring 8 in a multilayer state. In FIG. 1B, the redistribution layer 4 has three insulating layers 7, e.g., the first layer, the second layer, and the third layer in this order from the bottom, and two wirings 8, e.g., the first layer and the second layer in this order from the bottom.

Each of the insulating layers 7 is made of an insulating material such as polyimide, and one insulating layer 7 has a thickness dimension of, for example, about 7 μm. The wiring 8 is made of, for example, a metal material such as copper, and the thickness dimension of one layer is, for example, about 7 μm. A connection between the wiring 8 (the first layer) and the electrode pad 5 is defined by the via 9. A connection between the wirings 8 is made through the via 9. As shown in FIG. 2, the wiring 8 connected to the via 9 is extended outward from the electrode pad 5 in a plan view, and intersects perpendicularly to a boundary line B between the die 2 and the mold material layer 3.

In the present embodiment, as shown in FIGS. 1A, 1B and 2, the wiring 8 of the redistribution layer 4 has a reinforcing portion 10 in which the thickness of the copper material is thicker in the thickness direction of the layer within an area corresponding to the boundary region between the die 2 and the mold material layer 3 than the other portion. In this case, the reinforcing portion 10 is formed so as to straddle both sides of the boundary line B and has a length dimension of, for example, about 20 μm. As will be described later, the reinforcing portion 10 is configured by making a part of the wiring 8 to be substantially thick by providing a via connected to the wiring 8 using a process similar to the process of forming the via 9. As shown in FIGS. 1A and 1B, in the present embodiment, the reinforcing portion 10 is projected from the upper surface of the wiring 8 (the first layer) outward (upward in FIG. 1B) of the redistribution layer 4.

Further, in the present embodiment, as shown in FIG. 2, the reinforcing portion 10 is provided not entirely along the boundary line B between the die 2 and the mold material layer 3, but only on a part of the wiring 8 arranged so as to straddle the boundary line B. A part of the wiring 8 provided with the reinforcing portion 10 has, for example, a high degree of importance of a signal such as a communication line. The reinforcing portion 10 is not formed in the other wirings such as a power supply and a ground, for example, constructed of plural wirings, which can operate even when one wire is disconnected.

Figure 3:
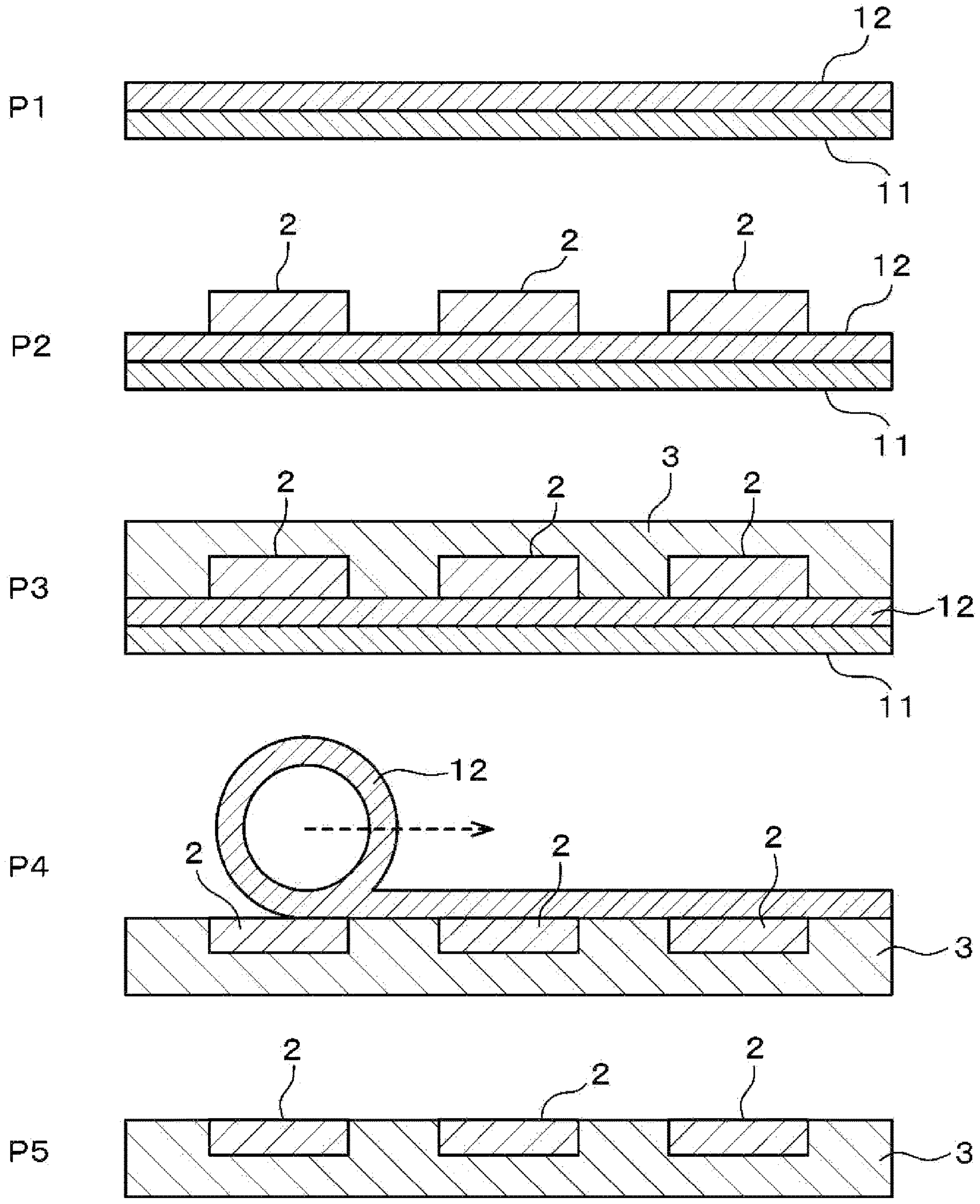
FIG. 3 is a sectional view for explaining a manufacturing process of the semiconductor device.
Figure 4:
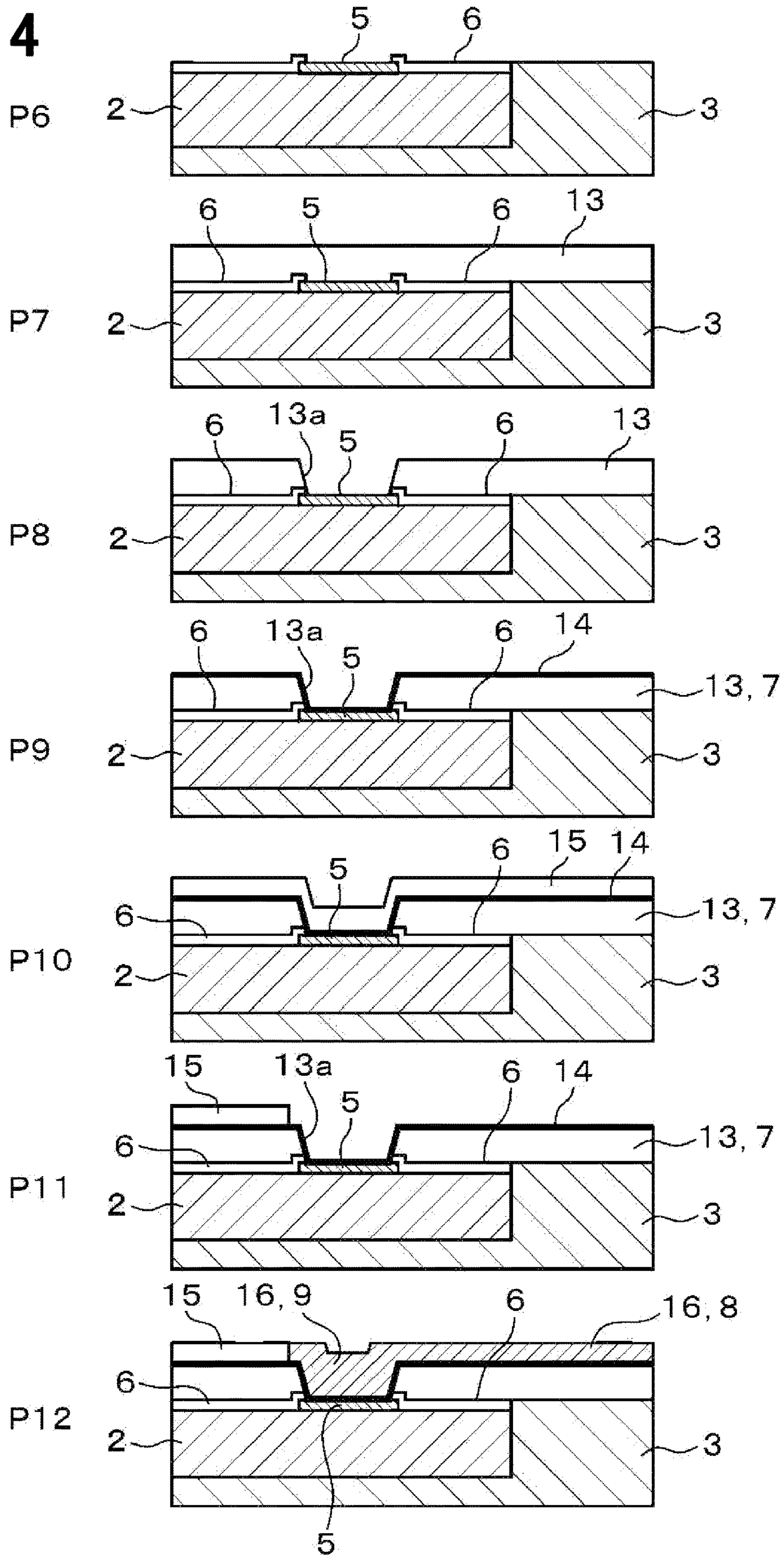
FIG. 4 is a sectional view for explaining a manufacturing process of the semiconductor device.
Figure 5:
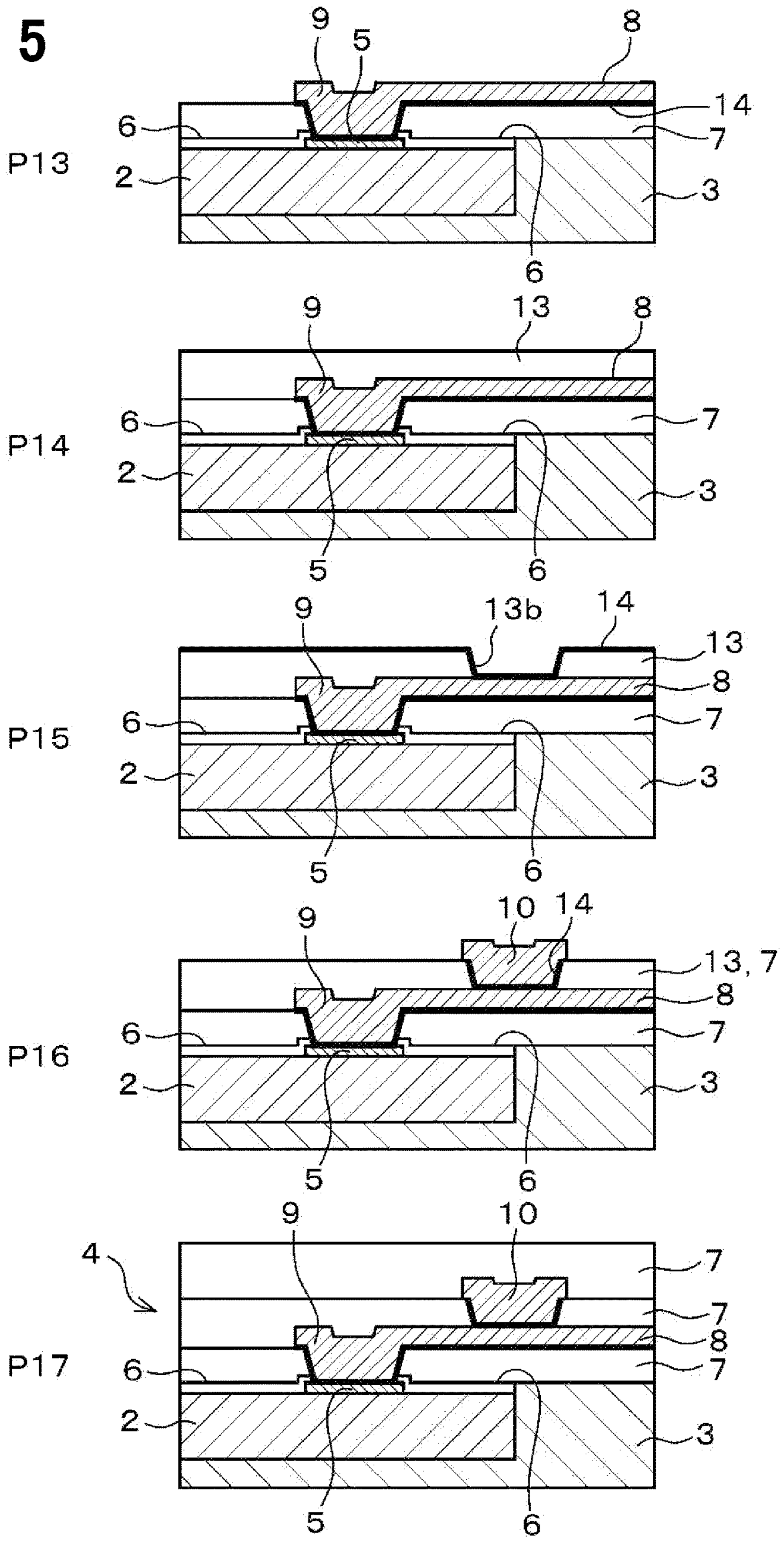
FIG. 5 is a sectional view for explaining a manufacturing process of the semiconductor device.

A manufacturing procedure of the semiconductor device 1 will be briefly described with reference to FIGS. 3 to 5. FIGS. 3 to 5 show the manufacturing process of the semiconductor device 1 in order. FIGS. 3 to 5 are originally a series of drawings, but are divided into three drawings for convenience in terms of space. First, in FIG. 3, process P1 represents preparing a carrier 11 having a temporary bonding film 12 on the upper surface. In process P2, the dies 2 are temporarily bonded to a predetermined position on the temporary bonding film 12 in a vertically inverted state with the electrode surface facing down. Although not shown in FIG. 3, the electrode pad 5 and the surface protective film 6 are provided on each of the dies 2.

In process P3, the carrier 11 to which the die 2 is temporarily bonded is housed in a mold (not shown), and molding with an epoxy resin is performed, such that the mold material layer 3 is formed around the die 2. Thereafter, in process P4, the carrier 11 is debonded, and the temporary bonding film 12 is peeled off from the die 2 and the mold material layer 3. As a result, as shown in process P5, the die 2 is embedded in the mold material layer 3 in a state where the electrode surface of the die 2 is exposed from the front surface of the mold material layer 3. In process P4 and the subsequent processes illustrated by being vertically inverted from process P3, the vertical direction is the same as FIGS. 1A and 1B.

In FIG. 4 illustrating one of the dies 2, at process P6, the die 2 having the electrode pad 5 and the surface protective film 6 is embedded in the mold material layer 3. In process P7, a photosensitive insulating material 13 such as polyimide is applied to the surface of the die 2 and the mold material layer 3. In process P8, a hole 13*a* to be the via 9 is formed at the upper surface of the electrode pad 5 by a known photolithography method in which the insulating material 13 is exposed to ultraviolet rays with a photomask disposed thereon and is developed to remove unnecessary portions. The insulating layer 7 (the first layer) is formed by curing the insulating material 13.

Thereafter, in process P9, a seed layer 14 made of copper is formed on the surface of the insulating layer 7 (the first layer) and layered along the hole 13*a* by, for example, a sputtering method. In process P10, a photosensitive resist layer 15 is applied to the entire surface of the seed layer 14. Next, in process P11, exposure and development are performed by a photolithography method to remove a part of the resist layer 15 corresponding to the wiring 8 (the first layer) and the via 9 to expose the seed layer 14, and the remaining portion of the resist layer 15 is cured.

In process P12, the surface of the seed layer 14 is plated with copper, for example, to form a copper plating layer 16. The copper plating layer 16 serves as the wiring 8 (the first layer), and also serves as the via 9 that connects the electrode pad 5 to the wiring 8, since copper is thickly filled in the hole 13*a*.

As shown in FIG. 5, in process P13, the resist layer 15 is removed, and the seed layer 14 covered with the resist layer 15 is removed. Thereafter, the same processes as those in processes P7 to P13 are repeated to sequentially form the redistribution layer 4. In process P14, a photosensitive insulating material 13 such as polyimide is applied to the insulating layer 7 (the first layer), the wiring 8 (the first layer), and the upper surface of the via 9.

Next, in process P15, a photomask is disposed on the insulating material 13, so as to form the insulating layer 7

(the second layer) by a known photolithography method, ultraviolet exposure is performed, and development is performed to remove the unnecessary portion. A hole 13*b* to be the reinforcing portion 10 is formed in the insulating material 13 as a via on the wiring 8 (the first layer), which extends over both sides of the boundary line B. In addition, although not illustrated, a hole serving as another via is formed. The seed layer 14 made of copper is formed on the insulating layer 7 (the second layer) and in the hole 13*b* by, for example, a sputtering method.

Then, in process P16, the photosensitive resist layer 15 is applied to the entire surface of the seed layer 14, and exposure and development are performed by a photolithography method. Thus, a part of the resist layer 15 corresponding to the wiring 8 (the second layer) and the reinforcing portion 10 is removed to expose the seed layer 14, and the surface of the seed layer 14 is plated with, for example, copper. As a result, the wiring 8 (the second layer) is formed, and at the same time, the reinforcing portion 10 is formed so as to be connected to the wiring 8 (the first layer), since copper is thickly filled in the hole 13*b*. Thereafter, the resist layer 15 is removed, and the seed layer 14 covered with the resist layer 15 is removed.

Thereafter, in process P17, a photosensitive insulating material 13 such as polyimide is applied to the insulating layer 7 (the second layer), the wiring 8 (the first layer), and the upper surface of the via 9, such that the insulating layer 7 (the third layer) is formed. Thus, the reinforcing portion 10 is provided in the redistribution layer 4 by projecting a part of the wiring 8 upward, that is, toward the outer surface. At this time, during the process of forming the redistribution layer 4, the reinforcing portion 10 can be formed simultaneously with the formation of the wiring 8 and the via 9 by the same process as the formation of the via 9. Note that plural semiconductor devices 1 are simultaneously formed in a form of being connected with each other by the mold material layer 3, and then singulation is performed.

Effects of the semiconductor device 1 of the present embodiment will be described. In the semiconductor device 1, for example, when the temperature changes in a use environment, bending stress is generated due to a difference in linear expansion coefficient between the die 2 made of silicon and the mold material layer 3 made of epoxy resin. The bending stress acts on a boundary region between the die 2 and the mold material layer 3, adjacent to the boundary line B of the wiring 8 of the redistribution layer 4. There is a possibility that a crack occurs in the wiring 8.

However, in the present embodiment, the reinforcing portion 10 is provided in the area corresponding to the boundary region between the die 2 and the mold material layer 3, in the wiring 8 of the redistribution layer 4, and is thicker in the thickness direction of the layer than the other portion. Since the reinforcing portion 10 is thick, the wiring 8 has higher rigidity at the reinforcing portion 10 than the other portions. Therefore, even when bending stress acts on the boundary region between the die 2 and the mold material layer 3, the mechanical strength of the wiring 8 is increased by the reinforcing portion 10, and the occurrence of crack and disconnection can be suppressed.

At this time, since the reinforcing portion 10 is provided in the wiring 8 as a manner thickened in the thickness direction of the redistribution layer 4, it is possible to eliminate the need to increase the width of the wiring 8 or to irregularly bend the wiring 8 in a plan view. Therefore, it is possible to suppress an increase in the wiring area as viewed in the surface direction and to secure the wiring property. As a result, according to the present embodiment, in the semiconductor device 1, the robustness against the disconnection caused by the thermal stress can be further enhanced for the wiring 8 of the redistribution layer 4.

In the present embodiment, the reinforcing portion 10 is configured by the via connected to the wiring 8, where the wiring 8 is partially thickened, using a process of forming the via 9 in the redistribution layer 4. Accordingly, since the reinforcing portion 10 can be formed simultaneously with the formation of the via 9 by using the process of forming the via 9 in the redistribution layer 4, the reinforcing portion 10 can be easily formed in the process of forming the redistribution layer 4 without requiring a special method or process.

In the present embodiment, the reinforcing portion 10 is provided in the wiring 8 so as to protrude upward in FIG. 1B (outward of the redistribution layer 4). In the semiconductor device, warpage deformation occurs such that the central portion protrudes outward of the redistribution layer 4 (upward in FIG. 1B) at a high temperature, and warpage deformation occurs such that the central portion protrudes inward of the redistribution layer 4 (downward in FIG. 1B) at a low temperature. In the present embodiment, the reinforcing portion 10 has higher resistant to warpage deformation at a high temperature, and stress can be reduced.

The reinforcing portion 10 is provided, for example, on a communication line, which is a part of the wiring 8 having a high signal transmission speed, while the wiring 8 is arranged so as to straddle the boundary region between the die 2 and the mold material layer 3 in the redistribution layer 4. Accordingly, the reinforcing portion 10 is selectively provided in a necessary portion of the wiring 8, and thus it is possible to minimize the overhead of the wiring region in the redistribution layer 4.

Figure 6:
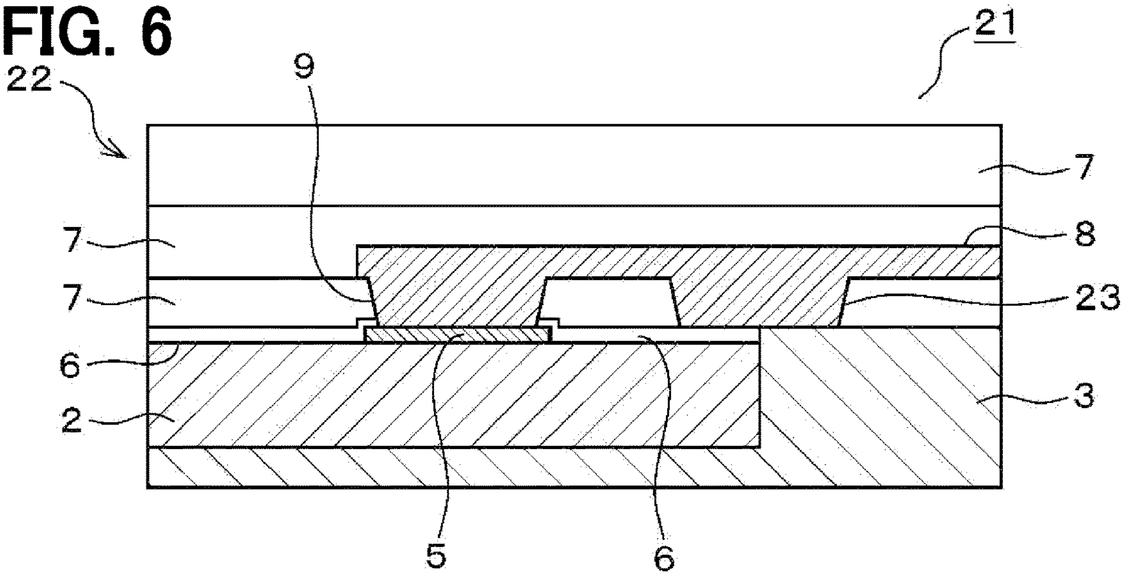
FIG. 6 is a schematic cross-sectional view illustrating a semiconductor device according to a second embodiment.

FIG. 6 shows a sectional view illustrating a semiconductor device 21 according to a second embodiment. The second embodiment is different from the first embodiment in the configuration of a reinforcing portion 23 provided in the wiring 8 of a redistribution layer 22. The semiconductor device 21 is a fan out wafer level package, and includes the die 2, the mold material layer 3 in which the die 2 is embedded, and the redistribution layer 22 provided on the die 2 and the mold material layer 3. The redistribution layer 22 includes the insulating layer 7 and the wiring 8 in a multilayer state.

In the present embodiment, in the wiring 8 (the first layer) of the redistribution layer 22, the reinforcing portion 23 is provided in an area corresponding to the boundary region between the die 2 and the mold material layer 3. The thickness of the copper material in the thickness direction of the layer (the vertical direction) is thicker at the reinforcing portion 23 than at the other portions. In the present embodiment, the reinforcing portion 23 is provided to protrude from the lower surface of the wiring 8 (the first layer) inward (downward in FIG. 6) of the redistribution layer 22. The lower end surface of the reinforcing portion 23 is in close contact with the upper surface of the die 2 and the mold material layer 3.

Although not described in detail, the redistribution layer 22 is formed by the same process as that described in the first embodiment. At this time, in process P8 (see FIG. 4), the insulating material 13 is exposed to ultraviolet rays by disposing a photomask, and is developed to form the hole 13*a* to be the via 9 and the hole to be the reinforcing portion 23. Then, in process P12, the wiring 8 (the first layer) is formed, and copper is filled in the hole, so that the reinforcing portion 23 is formed in the same manner as the via 9.

In the semiconductor device 21, the reinforcing portion 23 is provided in the area corresponding to the boundary region between the die 2 and the mold material layer 3, in the wiring 8 of the redistribution layer 22, and has a larger thickness in the thickness direction than the other portions. Thus, according to the second embodiment, similarly to the first embodiment, in the semiconductor device 21, it is possible to obtain an excellent effect that the robustness against the disconnection caused by thermal stress can be further enhanced for the wiring 8 of the redistribution layer 22.

Also in the present embodiment, the reinforcing portion 23 can be easily formed by forming the wiring 8 to be partially thick using the process of forming the via 9 in the redistribution layer 22. Further, in the present embodiment, the reinforcing portion 23 is provided in the wiring 8 so as to protrude inward (downward in FIG. 6) of the redistribution layer 22. As a result, the reinforcing portion 23 is resistant to warpage deformation such as downward convex deformation at a low temperature, and stress can be reduced.

Figure 7:
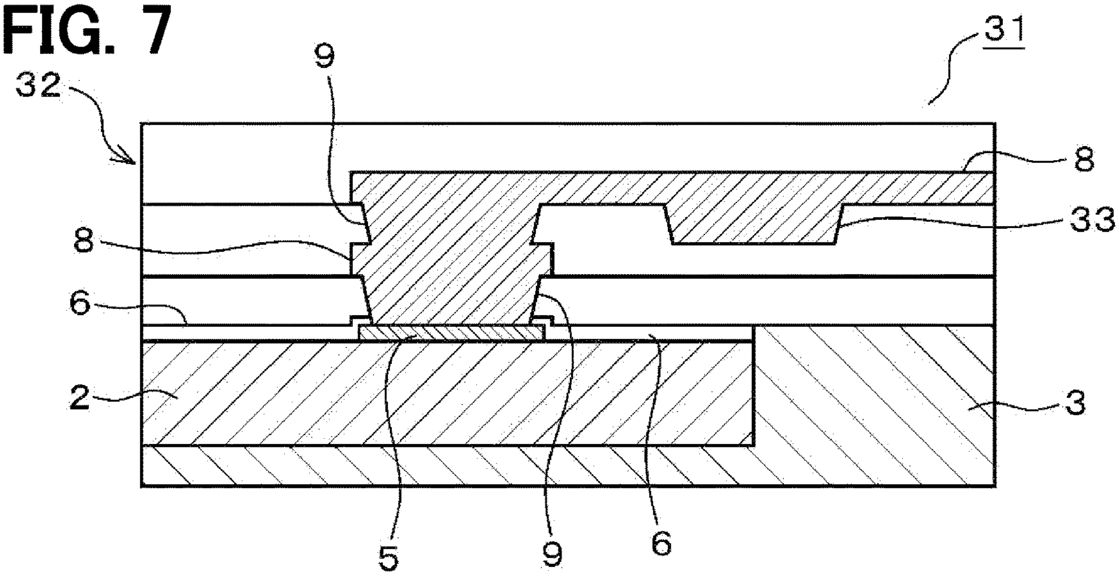
FIG. 7 is a schematic cross-sectional view illustrating a semiconductor device according to a third embodiment.

FIG. 7 shows a sectional configuration illustrating a semiconductor device 31 according to a third embodiment. In the third embodiment, the configuration of the reinforcing portion 33 provided in the wiring 8 of the redistribution layer 32 is different from those in the first and second embodiments. The semiconductor device 31 is a fan out wafer level package, and includes the die 2, the mold material layer 3 in which the die 2 is embedded, and the redistribution layer 32 provided on the die 2 and the mold material layer 3. The redistribution layer 32 includes the insulating layer 7 and the wiring 8 in a multilayer state.

In the present embodiment, the reinforcing portion 33 is formed on the lower surface of the wiring 8 (the second layer) of the redistribution layer 32, in which the thickness of the copper material is thicker in the thickness direction than the other portions, in the area corresponding to the boundary region between the die 2 and the mold material layer 3. The reinforcing portion 33 is provided at a position separated from the surface of the mold material layer 3 and the surface protective film 6 in the redistribution layer 32 via the insulating layer 7 (the first layer). In this case, a hole to be the via 9 and a hole to be the reinforcing portion 33 are formed in the insulating layer 7 (the second layer), and copper is filled in the holes, at the same time as the wiring 8 (the second layer) is formed, whereby the reinforcing portion 33 is formed together with the via 9.

In the semiconductor device 31 of the third embodiment, similarly to the second embodiment, by providing the reinforcing portion 33 in the semiconductor device 31, it is possible to obtain an excellent effect that the robustness against disconnection due to thermal stress can be further enhanced for the wiring 8 of the redistribution layer 32. In this case, since the reinforcing portion 33 is provided in the wiring 8 to protrude inward (downward in FIG. 7) of the redistribution layer 32, it is possible to raise the rigidity against warpage deformation such as downward convex at a low temperature and to reduce stress.

In the present embodiment, the reinforcing portion 33 is provided at a position separated from the surface of the mold material layer 3 in the redistribution layer 32. As in the second embodiment, when the reinforcing portion 23 is in contact with the surface of the mold material layer 3, the adhesiveness may be lower, compared with a case where the insulating layer 7 is in contact with the mold material layer 3. However, as in the present embodiment, by providing the reinforcing portion 33 on the lower side of the wiring 8 in the form of floating in the insulating layer 7, it is possible to restrict in advance a defect such as peeling due to low adhesiveness between the metal of the reinforcing portion 33 and the surface of the mold material layer 3.

Figure 8:
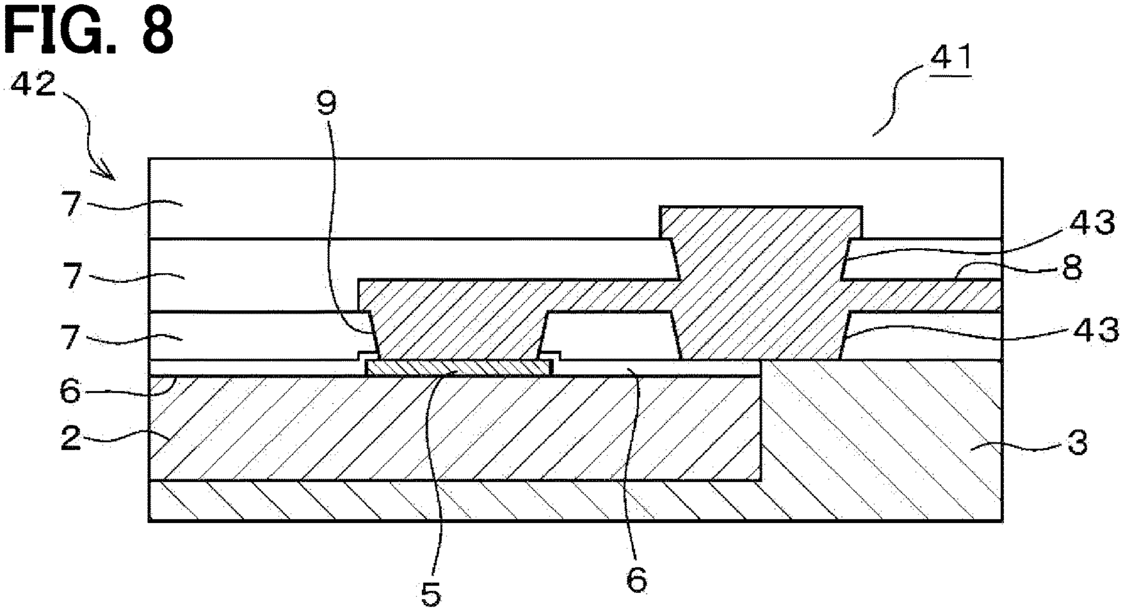
FIG. 8 is a schematic cross-sectional view illustrating a semiconductor device according to a fourth embodiment.

FIG. 8 shows a sectional configuration illustrating a semiconductor device 41 according to a fourth embodiment. In the fourth embodiment, the configuration of the reinforcing portion 43 provided in the wiring 8 of the redistribution layer 42 is different from those in the first to third embodiments. The semiconductor device 41 is a fan out wafer level package, and includes the die 2, the mold material layer 3 in which the die 2 is embedded, and the redistribution layer 42 provided on the die 2 and the mold material layer 3. The redistribution layer 42 includes the insulating layer 7 and the wiring 8 in a multilayer state.

In the present embodiment, the reinforcing portion 43 is provided within an area corresponding to the boundary region between the die 2 and the mold material layer 3, in the wiring 8 (the first layer) of the redistribution layer 42, to protrude both outward and inward of the redistribution layer 42. In the process of forming the via in the insulating layer 7 (the first layer) of the redistribution layer 42, the lower half portion of the reinforcing portion 43 can be formed simultaneously with the wiring 8 (the first layer). Thereafter, in the process of forming the via in the insulating layer 7 (the second layer) of the redistribution layer 42, the upper half portion of the reinforcing portion 43 can be formed simultaneously with the wiring 8 (the second layer).

When the reinforcing portion 43 is provided in the semiconductor device 41, it is possible to obtain an excellent effect that the robustness against disconnection due to thermal stress can be further enhanced for the wiring 8 of the redistribution layer 42. Since the reinforcing portion 43 is provided in the wiring 8 to protrude both upward and downward, the reinforcing portion has high rigidity against both warpage deformation upward at a high temperature and warpage deformation downward at a low temperature, and the effect of reducing stress is more excellent.

In each of the embodiments, the reinforcing portion is provided so as to straddle both sides of the boundary line B in the area corresponding to the boundary region between the die 2 and the mold material layer 3. However, the reinforcing portion may be provided so as to be positioned adjacent to the die 2 or the mold material layer 3, while it is possible to be resist against warpage deformation caused by heat. In addition, the process for forming the reinforcing portion is not limited to the above-described process, and various modifications are possible. In addition, the material of each part constituting the semiconductor device, the specific numerical values such as total number of layers in the redistribution layer, the thickness dimension, and the length and thickness dimension of the reinforcing portion are merely examples and can be appropriately changed.

The present disclosure has been described based on the embodiments, but it is understood that the present disclosure is not limited to the embodiments or structures. To the contrary, the present disclosure is intended to cover various modification and equivalent arrangements. In addition, various combinations and modes, and other combinations and modes including only one element, more elements, or less elements are also within the scope and idea of the present disclosure.

What is claimed is:

1. A semiconductor device comprising:

a die;

a mold material layer in which the die is embedded in a state where an electrode surface of the die is exposed from a surface of the mold material layer; and a redistribution layer provided on a surface of the mold material layer and having an insulating layer and a wiring in a multilayer state, as a fan out wafer level package, wherein the wiring of the redistribution layer has a reinforcing portion that is thicker in a thickness direction within an area corresponding to a boundary line between the die and the mold material layer than the other area, and the reinforcing portion is a reinforcing structure positioned to be aligned with the boundary line, wherein the boundary line is between the die and the mold material layer, wherein the reinforcing structure is formed by increasing a thickness of a portion of the wiring.

2. The semiconductor device according to claim 1, wherein the reinforcing portion has a via connected to the wiring inside the redistribution layer.

3. The semiconductor device according to claim 1, wherein the reinforcing portion protrudes from the wiring outward of the redistribution layer.

4. The semiconductor device according to claim 1, wherein the reinforcing portion protrudes from the wiring inward of the redistribution layer.

5. The semiconductor device according to claim 1, wherein the reinforcing portion protrudes from the wiring outward and inward of the redistribution layer.

6. The semiconductor device according to claim 1, wherein the reinforcing portion is located at a position separated from a surface of the mold material layer via the insulating layer in the redistribution layer.

7. The semiconductor device according to claim 1, wherein the reinforcing portion is provided only a part of the wiring so as to straddle a boundary region between the die and the mold material layer in the redistribution layer.

8. The semiconductor device according to claim 1, wherein the reinforcing portion is formed in a hole positioned to overlap with the boundary line.

9. The semiconductor device according to claim 1, wherein a surface of the reinforcing portion opposite to the wiring is not connected with another wiring.

10. The semiconductor device according to claim 1, wherein the reinforcing portion has no electrical connection with the wiring.

11. The semiconductor device according to claim 1, wherein the reinforcing portion has no function for electrical connection.

12. The semiconductor device according to claim 1, wherein the reinforcing portion is electrically isolated from the wiring.

13. The semiconductor device according to claim 1, wherein the reinforcing portion has a dimension which is a same as an outer dimension of the reinforcing structure.

14. The semiconductor device according to claim 1, wherein the reinforcing structure is provided not entirely along the boundary line but only on a part of the wiring that is arranged to straddle the boundary line.

* * * * *